US008744541B1

(12) United States Patent
Filippov et al.

(10) Patent No.: US 8,744,541 B1
(45) Date of Patent: Jun. 3, 2014

(54) SUPERCONDUCTING MULTI-BIT DIGITAL MIXER

(71) Applicant: Hypres, Inc., Elmsford, NY (US)

(72) Inventors: Timur V. Filippov, Mahopac, NY (US); Alexander Kirichenko, Pleasantville, NY (US); Deepnarayan Gupta, Hawthorne, NY (US)

(73) Assignee: Hypres, Inc., Elmsford, NY (US)

( * ) Notice: Subject to any disclaimer, the term of this patent is extended or adjusted under 35 U.S.C. 154(b) by 0 days.

(21) Appl. No.: 13/847,023

(22) Filed: Mar. 19, 2013

Related U.S. Application Data

(63) Continuation of application No. 13/196,494, filed on Aug. 2, 2011, now Pat. No. 8,401,600.

(60) Provisional application No. 61/369,927, filed on Aug. 2, 2010.

(51) Int. Cl.
*H01L 23/48* (2006.01)
*H01L 27/00* (2006.01)

(52) U.S. Cl.
USPC .......................................... 505/190

(58) Field of Classification Search
USPC ............................................. 505/190
See application file for complete search history.

(56) References Cited

U.S. PATENT DOCUMENTS 7,953,174 B2 * 5/2011 Asbeck et al. ............. 375/295
8,401,600 B1 * 3/2013 Filippov et al. ............. 505/190

* cited by examiner

*Primary Examiner* — Colleen Dunn
(74) *Attorney, Agent, or Firm* — Steven M. Hoffberg; Ostrolenk Faber LLP

(57) ABSTRACT

A superconducting multi-bit digital mixer, designed using rapid single flux quantum (RSFQ) logic, for multiplying two independent digital streams, at least one of these comprising a plurality of parallel bit lines, wherein the output is also a similar plurality of bit lines. In a preferred embodiment, one of the digital streams represents a local oscillator signal, and the other digital stream digital radio frequency input from an analog-to-digital converter. The multi-bit mixer comprises an array of bit-slices, with the local oscillator signal generated using shift registers. This multi-bit mixer is suitable for an integrated circuit with application to a broadband digital radio frequency receiver, a digital correlation receiver, or a digital radio frequency transmitter. A synchronous pulse distribution network is used to ensure proper operation at data rates of 20 GHz or above.

20 Claims, 23 Drawing Sheets

Binary Multiplication

| C\D | -7 -5 -3 -1 1 3 5 7 |
|---|---|
| -1 | 7 5 3 1 -1 -3 -5 -7 |
| 1 | -7 -5 -3 -1 1 3 5 7 |

×

↓ ⊕

XOR Function

| C\D | 0 1 2 3 4 5 6 7 |
|---|---|
| 1 | 7 6 5 4 3 2 1 0 |
| 0 | 0 1 2 3 4 5 6 7 |

SUPERCONDUCTING MULTI-BIT DIGITAL MIXER

RELATED APPLICATION

The present application is a Continuation of U.S. patent application Ser. No. 13/196,494, filed Aug. 2, 2011, now U.S. Pat. No. 8,401,600, issued Mar. 19, 2013, which claims benefit of priority from Provisional Patent Application 61/369,927, "Superconducting and semiconductor-superconductor hybrid systems and devices, and methods for packaging and manufacturing thereof", filed Aug. 2, 2010, the entirety of which are expressly incorporated herein by reference.

STATEMENT OF GOVERNMENT INTEREST

This invention was made with government support under U.S. Office of Naval Research Contracts N00173-07-C-4002 and N00014-08-C-0603. The U.S. Government has certain rights in the invention.

FIELD OF THE INVENTION

The present invention relates to digital radio-frequency receiver technology, and more particularly a digital downconverter circuit implemented using superconducting electronic components.

BACKGROUND OF THE INVENTION

FIGS. 1A and 1B show a classic analog radio receiver and a fully digital, radio frequency receiver. The core of a conventional radio receiver comprises a circuit that mixes the input radio signal from the antenna with a local oscillator (LO). Both the LO and the mixer are analog devices. The mixer generates frequency components corresponding to the sum and difference of the input frequencies of the radio frequency (RF) signal and the LO. An analog low-pass filter (LPF) is used to isolate the down-converted baseband signal, which can then be digitized in a baseband analog-to-digital converter (ADC). FIG. 1A shows a quadrature receiver (also called an I&Q receiver) with a local oscillator having in-phase and quadrature (90-degree phase shifted) outputs, which are mixed with the input RF signal to produce I and Q signals, respectively. The baseband I and Q signals can be combined in a Digital Baseband Processor to demodulate one or more communication signals of interest.

In a digital radio frequency receiver (sometimes known as a software radio or software-defined radio or SDR), the conversion to digital is carried out directly on the RF signal coming from the antenna. As indicated in FIG. 1B, the same set of operations need to be carried out as in FIG. 1A, but now in the digital domain. These include a digital LO, a digital mixer (really a digital multiplier), and a digital decimation filter (DDF, the digital equivalent of a low-pass filter). These digital operations are implemented without noise, interference, or non-ideal behavior, and may be easily reprogrammed for different communication parameters. Furthermore, the digital radio frequency receiver is compatible with a very broad RF bandwidth, which may comprise a plurality of communication signals. These advantages are increasingly desirable for modern RF receivers. However, a requirement of the digital radio frequency approach is that for optimum performance, the RF ADC must operate at a very high sample rate (typically multi-GHz), and in some cases also needs a plurality of parallel data bits to increase the dynamic range. This high rate requirement is because the sampling should be above the Nyquist rate (twice the highest frequency component of the signal), but in some cases the radio frequency signal can be undersampled, so long as the sampling is precisely timed. Assuming that undersampling is not, or cannot be used, the following mixer and digital filter must also operate at the very high data rate, with a plurality of data bits. These requirements have limited the availability of such a digital radio frequency receiver. See, e.g., 7,956,640; 7,928,875; 7,903,456; 7,876,869; 7,728,748; 7,701,286; 7,680,474; 7,598,897; 7,443,719; 7,362,125; 7,313,199; 7,280,623; 6,781,435; Muhammad, K.; Staszewski, R. B.; Leipold, D.; "Digital RF processing: toward low-cost reconfigurable radios", IEEE Communications Magazine, August 2005, Volume: 43 Issue: 8, pages: 105-113; Brock, D. K.; Mukhanov, O. A.; Rosa, J.; "Superconductor digital RF development for software radio", IEEE Communications Magazine, February 2001, Volume: 39 Issue: 2, page(s): 174-179; Saulnier, G. J.; Puckette, C. M., IV; Gaus, R. C., Jr.; Dunki-Jacobs, R. J.; Thiel, T. E.; "A VLSI demodulator for digital RF network applications: theory and results"; IEEE Journal on Selected Areas in Communications, October 1990, Volume: 8 Issue: 8, page(s): 1500-1511, each of which is expressly incorporated herein by reference.

Superconducting electronics using rapid-single-fluxquantum (RSFQ) circuits provide the world's fastest digital circuits (operating at rates of up to 40 GHz and higher). And indeed, very fast RSFQ ADCs, digital mixers, and digital filters have been demonstrated. However, most of these circuits have been relatively small circuits, operating on a single bitstream of data. See, for example, U.S. application Ser. No. 11/966,897, "Oversampling Digital Receiver for Radio Frequency Signals", D. Gupta, and U.S. Pat. No. 7,280,623, "Digital RF Correlator for Multipurpose Digital Signal Processing", D. Gupta, et al., both of which are expressly incorporated herein by reference.

For the case of a superconducting digital mixer, several designs of a fast single-bit RSFQ digital mixer were presented by Kirichenko et al. ("Superconducting Digital Mixer", U.S. Pat. No. 7,680,474), expressly incorporated herein by reference, one of which is shown schematically in FIG. 2. This is based on the mapping convention of FIG. 3A, where binary multiplication of a bipolar signal maps onto the exclusive OR (XOR) function of a unipolar binary signal.

To improve this technology and to make it more practical, multibit implementations must be developed. The present invention focuses on the development of an integrated multibit digital mixer based on RSFQ technology, building upon the foundations of an earlier single-bit mixer of Kirichenko.

SUMMARY OF THE INVENTION

The present technology provides an XOR-based mixer cell similar to that in FIG. 2, which can be used to design, and lay out as an integrated circuit, a multi-bit mixer cell which can also perform at data rates of tens of GHz. Two preferred embodiments are presented; an n×1 mixer in which an n-bit digitized data stream is mixed with a 1-bit LO; and a 1×k mixer in which a 1-bit data stream is mixed with an k-bit LO, where n and k represent integers greater than 1. Both embodiments are organized into single-bit-slices that can be tiled together in an IC to scale to a structure with an arbitrary number of bits. Furthermore, both embodiments make use of a shift register (SR) as a code generator for the LO, incorporate a synchronous pulse distribution network (SPDN) for proper multibit timing, and are otherwise very similar in design and performance. The data and the LO may operate at different clock rates, since the mixer elements themselves are asynchronous. Furthermore, it is shown how the multibit mixer may be integrated with a multi-bit ADC and a multi-bit DDF to form an improved multi-bit digital radio frequency receiver.

Note that in these cases, each bit is processed separately, in parallel; no carry operations are required for this procedure. This is illustrated with the 3-bit multiplication table in FIG. 3B, using the same mapping convention per bit as in FIG. 3A. Note also that this mapping cannot be directly extended to full n×k multiplication, where carry operations would be necessary, making the required circuit much more complicated.

A block diagram for an I&Q digital 1×k mixer according to the invention is shown in FIG. 4, with two 1×k mixers, data and LO clock lines. Each mixer is comprised of k slices (typically arrayed vertically), each slice comprised of a cell structure such as that shown in FIG. 5. This generates a k-bit mixer output for each of the two (I and Q) channels. Unlike the block diagram of FIG. 1B, which shows a separate LO generator, the circuit of FIGS. 4 and 5 preferably integrates the multi-bit LO generator elements for each bit into the mixer slice itself. Note specifically the shift register SR on the right of FIG. 5, which comprises the LO generator for the given bit. Prototype mixer circuits with a 1×3 (3-bit LO) and a 3×1 (3-bit input data) are presented below in more detail, with IC fabrication and experimental test results confirming proper operation.

An alternative embodiment of a 1×k multi-bit mixer is also presented, which comprises an external LO generator, rather than the internal LO generator as shown in FIGS. 4 and 5. In this example, with a block diagram as shown in FIG. 6, the LO multi-bit code is synthesized in advance and stored in a room-temperature memory with a fast readout. This multi-bit code is then serialized and sent out to the superconducting circuit as a single-bit sequence (in order to avoid timing skew between the bits). This LO code is then deserialized and resynchronized in a fast cache memory that is integrated with the multi-bit mixer. Further details of this embodiment are described below.

Multi-bit digital mixer circuits of the invention are not limited to application to a digital downconverter in a digital radio frequency receiver. They may also be used in a digital correlation receiver, where a more general synthesized digital signal may be used instead of a digital local oscillator. Alternatively, a similar multi-bit digital mixer may be used as the digital upconverting element in a digital radio frequency transmission system.

It is therefore an object to provide a multi-bit digital mixer comprising at least one Josephson junction, configured in a circuit to receive a first digital input signal and a second digital input signal and to generate a multi-bit parallel output signal representing the multiplication product of the first digital input signal and the second digital input signal.

The second digital input signal may be received from a digital local oscillator. The digital LO signal may be generated using a shift register.

The first digital input signal may be communicated over at least one matched pair of complementary binary inputs.

The circuit may comprise a plurality of bit slices, having a corresponding bit slice for each parallel bit of the output signal.

The circuit may comprise at least one respective XOR-based mixer cell for each bit of the multi-bit parallel output signal.

Each of the first digital input signal and the second digital input signal, or both, may comprise a multi-bit signal. The multi-bit signals may be parallel or serial.

At least one of the first and second digital input signals may comprise a multi-bit parallel signal which incorporates a synchronous pulse distribution network (SPDN) for proper multibit timing. The SPDN may provide global bit synchronization for both input signals.

The circuit may comprise at least one asynchronous RSFQ mixer. For example, the mixer may be an asynchronous XOR device.

The first digital input signal and the second digital input signal may have respectively different clock rates.

The first digital input signal may receive a signal derived from an analog to digital converter, and the second digital input signal receives a signal derived from a digital local oscillator. The analog to digital converter may receive a modulated radio frequency signal, and the circuit may be configured to mix the modulated radio frequency signal to generate the multi-bit parallel output signal representing at least a difference frequency of the modulated radio frequency signal and the digital local oscillator.

The circuit may be configured to generate the multi-bit parallel output signal representing the multiplication product of the first digital input signal and the second digital input signal substantially without a carry operation.

The circuit may further comprise a semiconductor circuit, configured to generate at least one of the first digital input signal and the second digital input signal, further comprising an interface circuit configured to present information from the semiconductor circuit to the circuit comprising the at least one Josephson junction.

The circuit may also comprise a semiconductor circuit, further comprising an interface circuit configured to present information from the circuit comprising at least one Josephson junction to the semiconductor circuit.

The circuit may be configured as a digital down converter of a digital radio frequency receiver receiving analog radio frequency information modulated on a carrier having a carrier frequency of at least 250 MHz, comprising a superconducting analog to digital converter having a sampling rate of at least 1 GHz and a multi-bit output. Thus, for example, a 40 GHz analog to digital converter may be processed to produce a 3-bit signal at a rate of 5 GHz.

The circuit may be configured to produce an updated multi-bit parallel output signal at a rate of at least 20 GHz.

The circuit may be configured as a receiver for receiving quadrature phase modulated signals, further comprising an analog to digital converter digitizing a radio frequency signal at a digital sample rate of at least 1.5 GHz, wherein at least two local oscillator signals are provided by at least one shift register configured as a code generator to each of at least two multi-bit digital mixers, each multi-bit mixer being configured to produce a multi-bit parallel output signal representing the multiplication product of the digital output of the analog to digital converter and a respective representation of the local oscillator signals, wherein the local oscillator signals are respectively time-shifted replicas of each other.

Another object provides a digital mixing method, comprising: receiving two asynchronous rapid single quantum flux (RSFQ) signals, at least one of the received RSFQ signals comprising a plurality of parallel bits, wherein each signal bit is represented as complementary signal pairs; ensuring proper timing of the plurality of parallel bits of the two asynchronous RSFQ signals with a synchronous pulse distribution network (SPDN); and mixing the properly timed two asynchronous RSFQ signals with an array of XOR-based asynchronous mixer cells, at least one for each parallel bit line.

BRIEF DESCRIPTION OF THE DRAWINGS

FIG. 3B shows the logic table for a 1×3 bit XOR based digital mixer, mapping bipolar binary multiplication to bit-parallel XOR functions.

DETAILED DESCRIPTION OF THE PREFERRED EMBODIMENTS

Digital down-conversion requires multiplication of a digitized radio frequency signal with a digital local oscillator signal. A first-generation digital radio frequency receiver (following FIG. 1B) was developed by HYPRES, Inc. (see D. Gupta, et al., "Digital Channelizing Radio Frequency Receiver," *IEEE Trans. Appl. Supercond.*, vol. 17, no. 2, pp. 430-437, June 2007, expressly incorporated herein by reference), also known as an All-Digital Receiver (ADR)). This included a 1×1-bit mixer to process a 1-bit data stream from a modulator (ADC) and a 1-bit square wave from a local oscillator. The next steps in the development of improved digital radio frequency receivers are the processing of either n-bit data streams from advanced low pass (LP) or band pass (BP) modulators, or the use of a k-bit local-oscillator stream.

Figure 2:
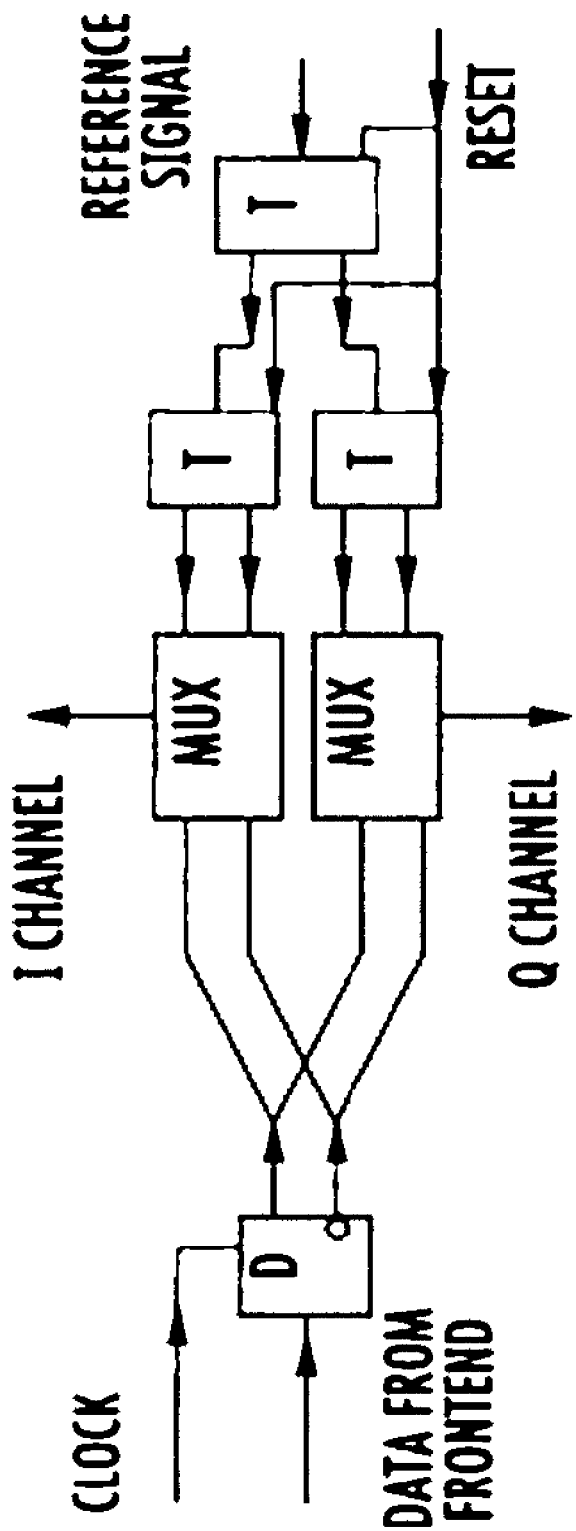
FIG. 2 shows the cell diagram of a 1-bit asynchronous digital mixer of the prior art, according to Kirichenko et al. (U.S. Pat. No. 7,680,474), based on a streaming-XOR functionality
Figure 3A:
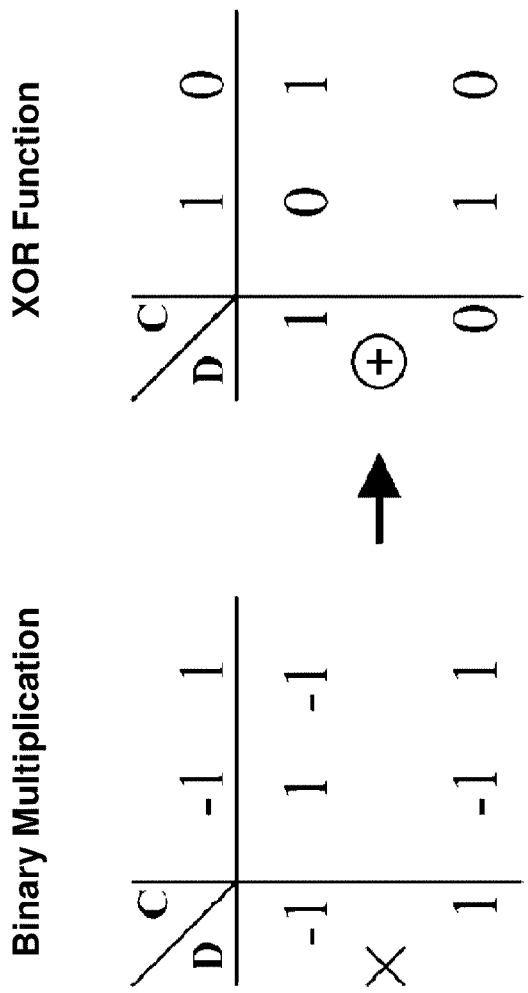
FIG. 3A shows the logic table for a 1-bit XOR-based digital mixer, mapping bipolar binary multiplication to an XOR function of unipolar signals.

The present approach is based on the design and successful testing of the 1×1-bit mixer (A. Kirichenko et al., U.S. Pat. No. 7,680,474) shown in FIG. 2. The multiplication table for the 1×1-bit mixer and its mapping convention for a bipolar data stream (D) and a particular local oscillator code (C) are shown in FIG. 3A. This allows one to treat multiplication as an exclusive-OR (XOR) function with data and code inputs.

Figure 7:
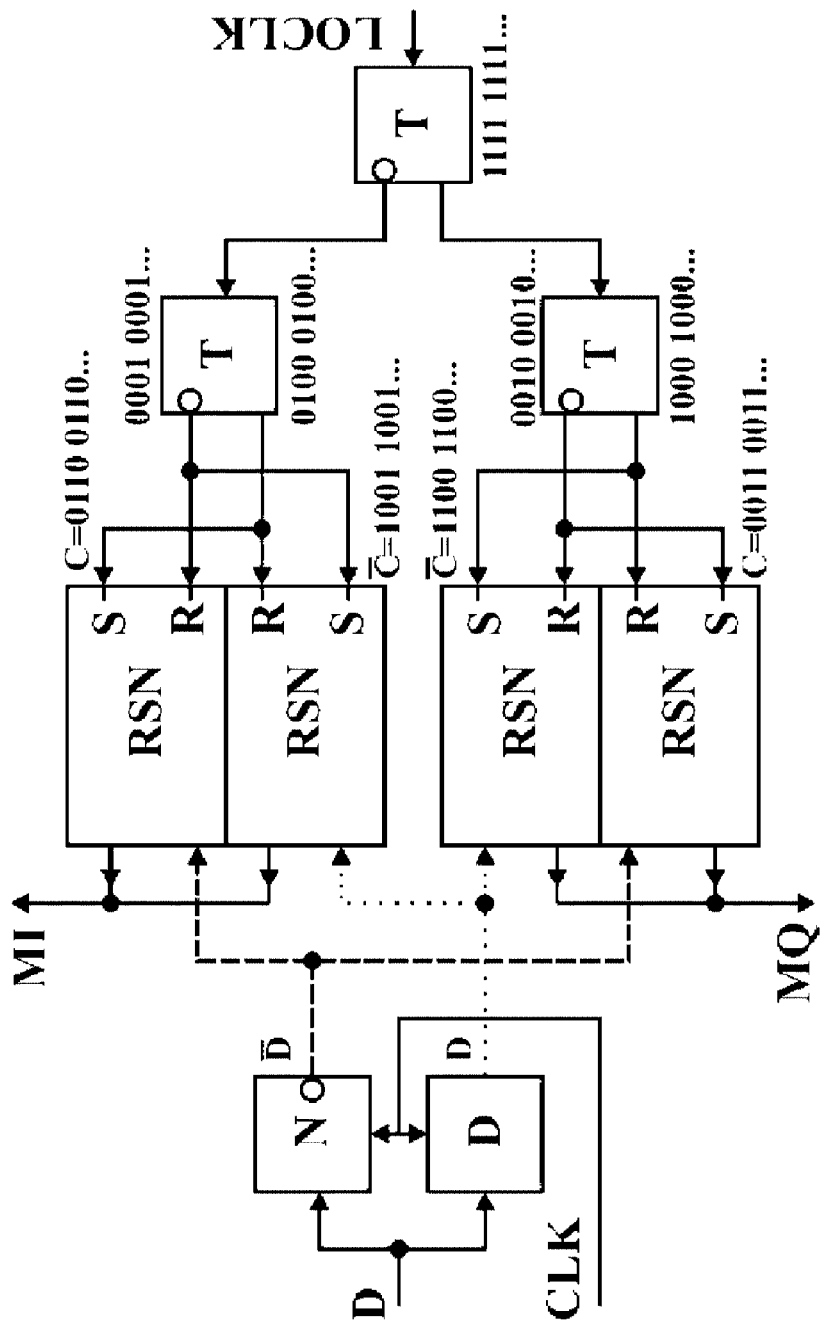
FIG. 7 shows the block diagram of an improved 1×1 bit I&Q mixer, modified from that in FIG. 2.

Note that the original design of a 1×1-bit mixer (FIG. 2) differs slightly from the improved one shown in FIG. 7. In its original version, the D-cell (D flip flop or DFF) and inverter (N cell) were combined into a D-cell with complementary outputs (DFFC), and a multiplexer cell (MUX) was used instead of a matched pair of RSN cells (RS flip-flops with nondestructive readout). Functionally these two designs are largely equivalent, and while the original design was slightly more compact, it was less robust and more susceptible to stray magnetic fields, limiting its performance margins. Furthermore, the logic for generating the four phases of the local oscillator was modified using the Multiphase Clock Circuit of D. Kirichenko (U.S. Pat. No. 7,786,786, expressly incorporated herein by reference) to overcome the susceptibility of the earlier design to any error in the toggle flip-flop (TFF, or simply 'T') tree, causing a permanent phase slip between I and Q streams. This multiphase clock circuit comprised a chain of D-flip-flops.

The rule of action for the design in FIG. 7 can also be formulated as: data bit D reads complement code $\overline{C}$, complement data $\overline{D}$ reads C. This statement is a guide to understand the block-diagram depicted in FIG. 7. The input data stream D is converted into two streams D and its complement $\overline{D}$ by splitting and passing input data through a D-cell and an inverter (N). These data are then mixed in I and Q channels, which are each formed by a pair of RSN cells. Set (S) and reset (R) input terminals of each RSN pair are controlled by an LO code in such a way that either D or its complement $\overline{D}$ data stream can go through the RSNs. There is no signal collisions at the mixer's I and Q outputs (MI and MQ in FIG. 7) because either D or its complement $\overline{D}$ exist, and only one RSN cell of a pair is set by the applied code. The LO code in this particular 1×1-bit mixer implementation is generated by applying an LO clock (LOCLK) to a binary tree of toggle-flip-flops (T). The bit streams shown next to the T cells illustrate how an input bit sequence from LOCLK generates the LO codes C and $\overline{C}$. Note also that the data clock CLK and LO clock LOCLK are distinct, and can be at different frequencies; the mixer elements themselves are asynchronous.

The mapping convention for the 1×1-bit mixer can be generalized to a 1×k-bit mixer as illustrated in FIG. 3B. One can see that the multiplication function can be replaced by an bit-parallel exclusive-OR (XOR) operation and the mixing function can be rephrased as a simple rule: D ($\overline{D}$) reads out $\overline{C}$ (C).

Figure 8:
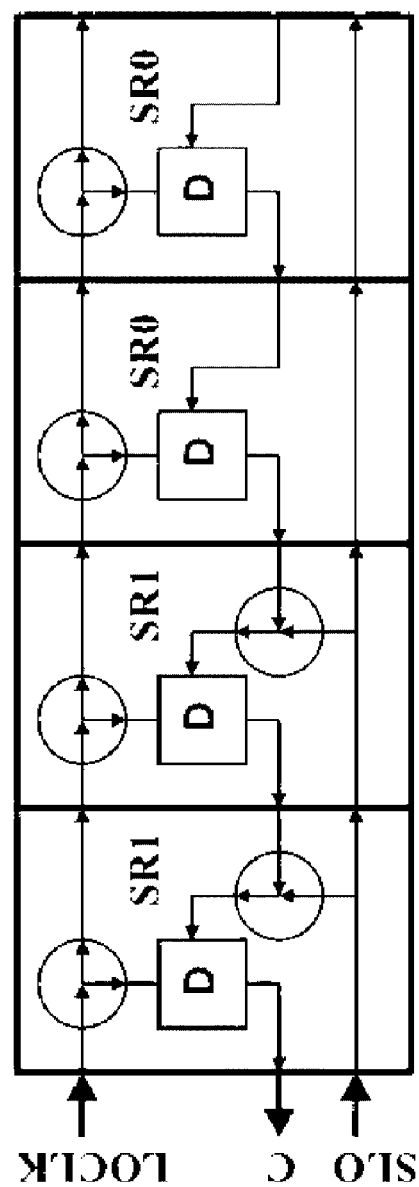
FIG. 8 shows the cell diagram of a shift register-based LO for integration with a bit-slice of the 1×k digital mixer of FIG. 5.

The key element of a bit-slice of the 1×k-bit mixer (FIG. 5) is a pair of RSN cells with their states controlled by an LO code and read out by D or its complement $\overline{D}$. The multi-bit mixer LO code can be quite complicated, and simple approaches like the binary tree of T-flip-flops do not work. To generate LO code for each slice, a shift-register (SR) based structure depicted in FIG. 8 was developed, which represents the internal structure of the cell labeled SR at the right of FIG. 5. The SR is initialized by a set-local-oscillator (SLO) pulse sent to all SR stages. The resulting state of a particular D-cell depends on its connectivity with the SLO distribution line. The SLO pulse either goes in or passes by the D-cell of a particular SR stage. Then, the LO clock (LOCLK) reads out the content of the leftmost D-cell and shifts the rest from right to left. Finally, all SR stages will be read out by LOCLK pulses and then be rewritten by another SLO pulse. Note that SLO pulses can be derived from the LOCLK sequence by sending them to a frequency divider (LO FD in FIG. 4). The required SLO pulse frequency depends on the length of LO code representation. The propagation of SLO pulses between bit-slices is controlled by the LOCLK as shown in FIG. 5. Note that the LO sequence in FIG. 7 is hard-wired by the structure of the cells; in FIG. 8, the sequence is 1100, from left to right.

As shown in FIG. 5, the generated LO code goes to a pair of cells composed of a D-cell and an inverter N to be converted into complementary streams of C and $\overline{C}$. States of RSN cells are controlled by C and $\overline{C}$ but read out by D and complement $\overline{D}$ as a result of performing a mixing function.

Figure 4:
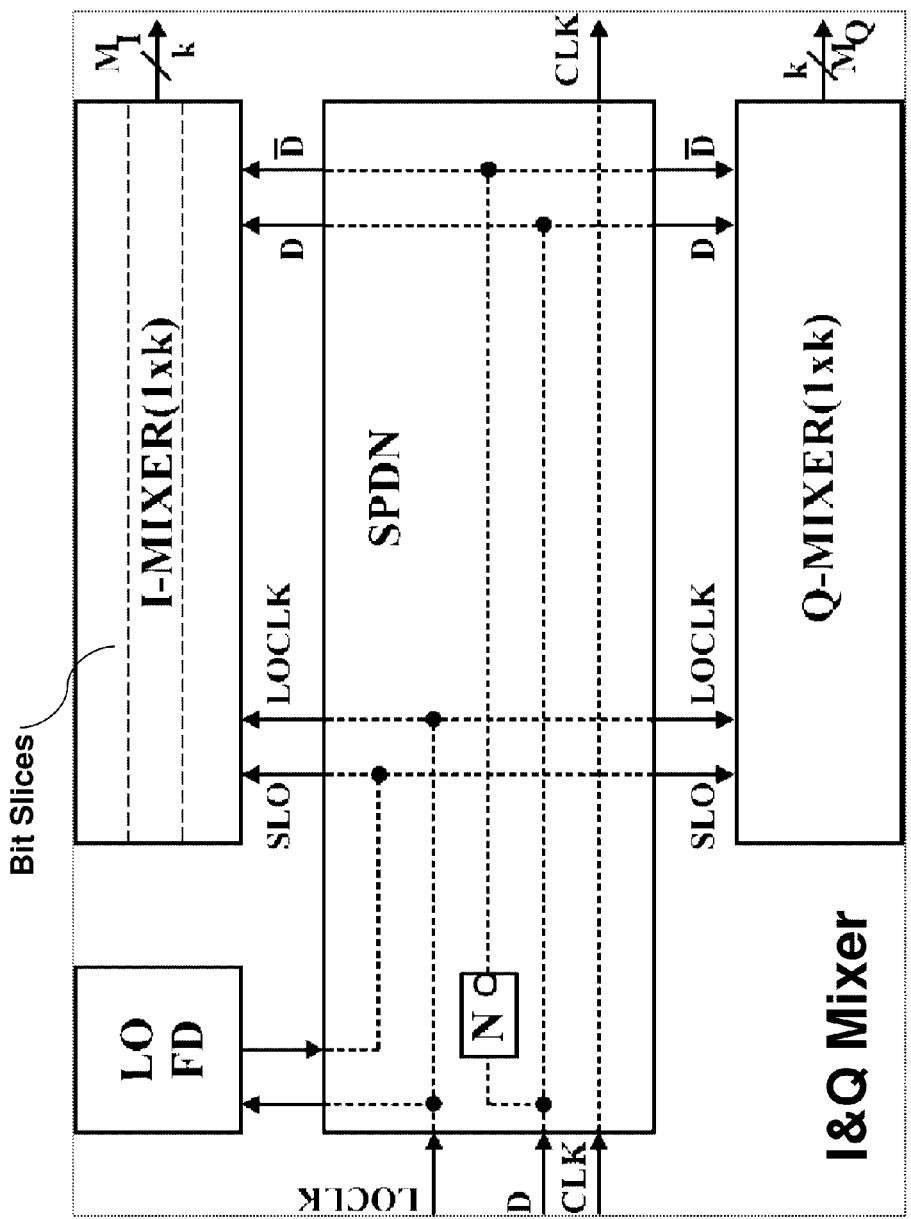
FIG. 4 shows the block diagram of an I&Q digital mixer for a 1-bit data signal with a k-bit LO (1×k mixer).
Figure 5:
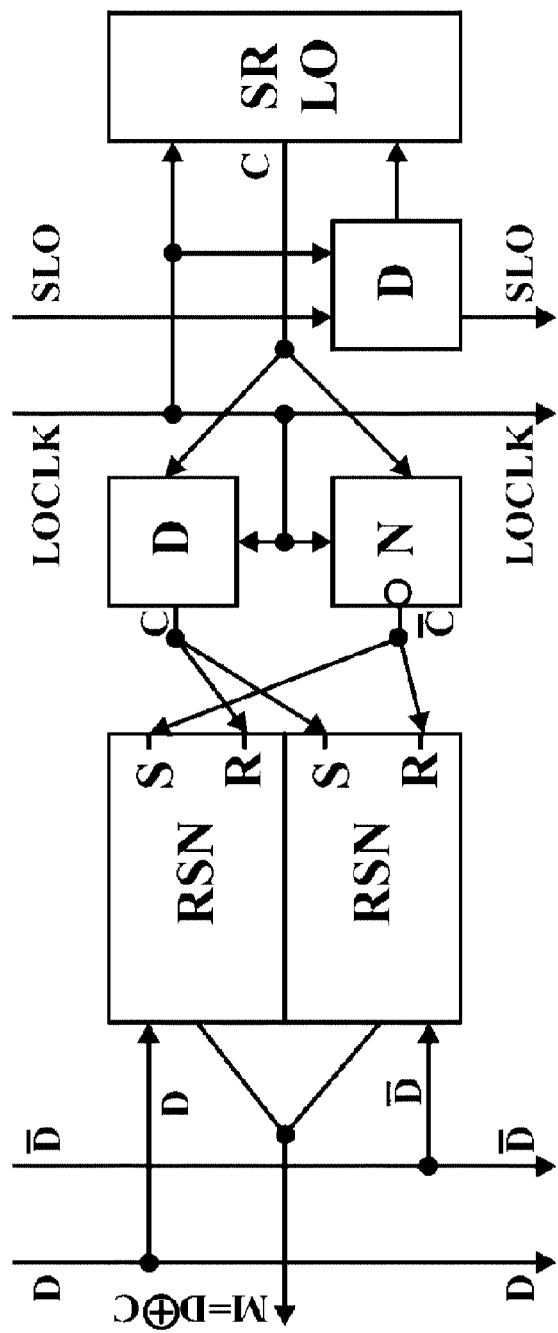
FIG. 5 shows the cell diagram of a bit-slice of a 1×k digital mixer with integrated LO of FIG. 4.

FIG. 4 shows the block diagram of an entire I&Q mixer consisting of I and Q channels and a synchronous pulse distribution network (SPDN) that delivers all pulses (D, $\overline{D}$, LOCLK, SLO) to the I- and Q-mixers under clock control.

Figure 9:
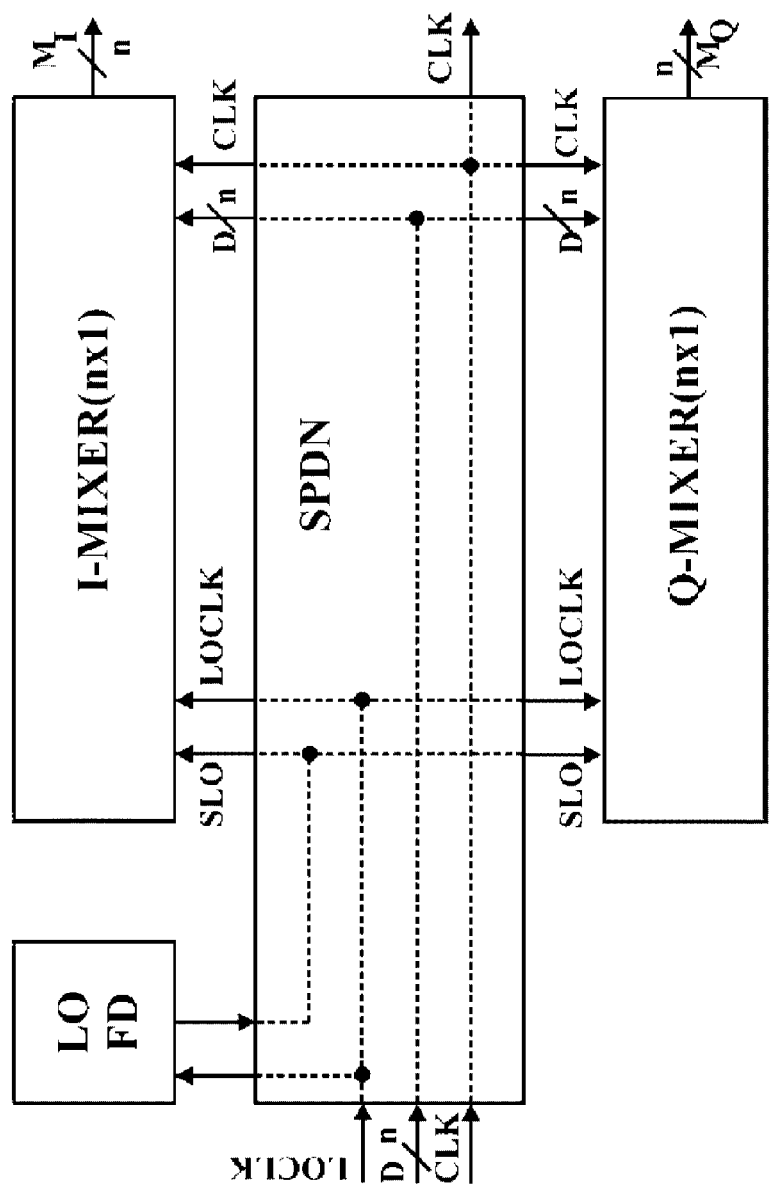
FIG. 9 shows the block diagram of an I&Q mixer for an n-bit data signal with a 1-bit LO (n×1 mixer).
Figure 10:
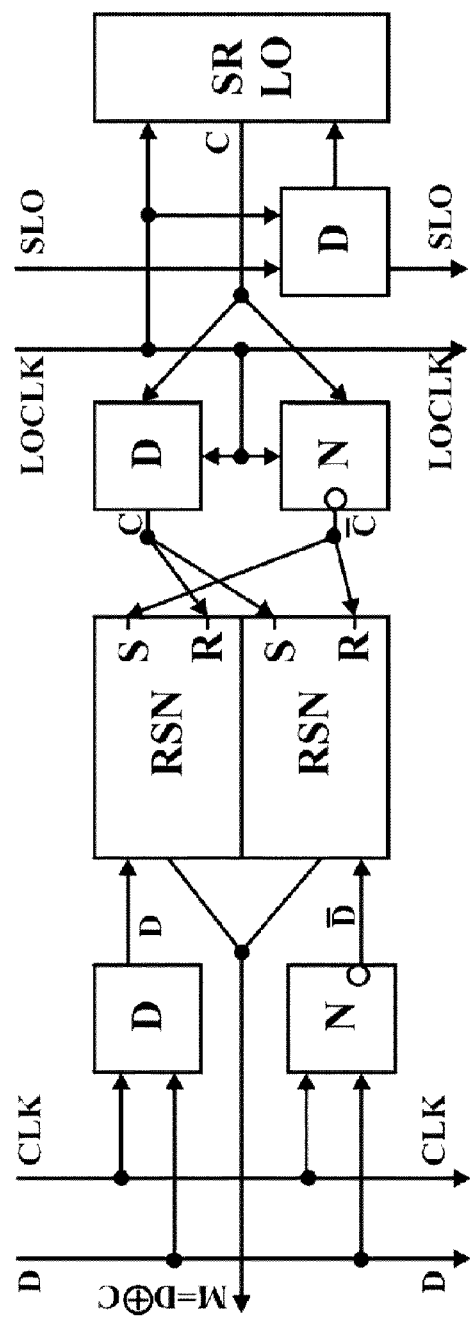
FIG. 10 shows the cell diagram of a bit slice of an n×1 digital mixer of FIG. 9.

The 1×k-bit mixer described above can be converted into an n×1-bit mixer without making many changes to the building blocks. Assuming that an n-bit input data stream can be delivered to the I- and Q-mixers through a properly modified SPDN, and then convert each data bit into a complementary pair of D and $\overline{D}$ inside a bit-slice, the block diagram depicted in FIGS. 9 and 10 is arrived at. This differs from the 1×k-bit mixer only by the addition of a pair of D cell and an inverter on the left side of block-diagram in FIG. 10.

The block diagram in FIG. 9 of the entire I&Q n×1-mixer looks similar to 1×k-mixer, but the SPDN for the n×1-mixer distributes n-bit data instead of a one-bit number and its complement. All pulses inside the SPDN are controlled by the clock and their delays to I- and Q-mixers are equalized.

Figure 11:
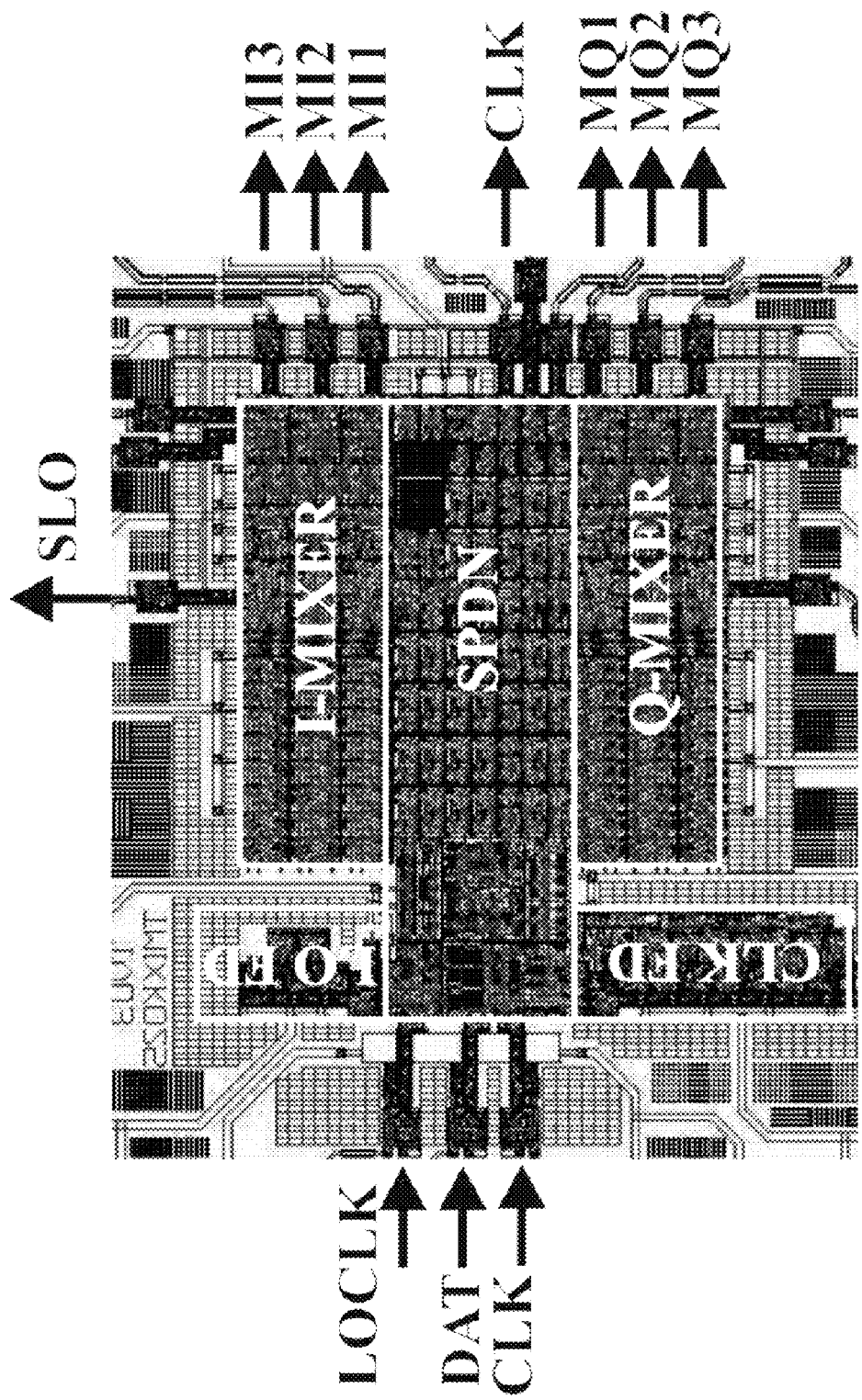
FIG. 11 shows the chip layout of a prototype 1×3 I&Q mixer test chip.

Several chips were designed to test our k-bit and n-bit mixers and their components. All chips were fabricated using the HYPRES superconducting Nb Josephson junction IC process with critical current density $J_c$=4.5 kA/cm$^2$. The chip layout of a 1×3-mixer is shown in FIG. 11. This matches the block-diagram in FIG. 4 except for the addition of frequency divider CLKFD. This is used to generate the Nyquist clock and other pulses required for the digital decimation filters (DDFs) that follow the I&Q mixer. They are delivered to the DDFs by the SPDN. The LO and CLK frequency dividers were kept separate to avoid common locking of both frequencies.

Figure 12A:
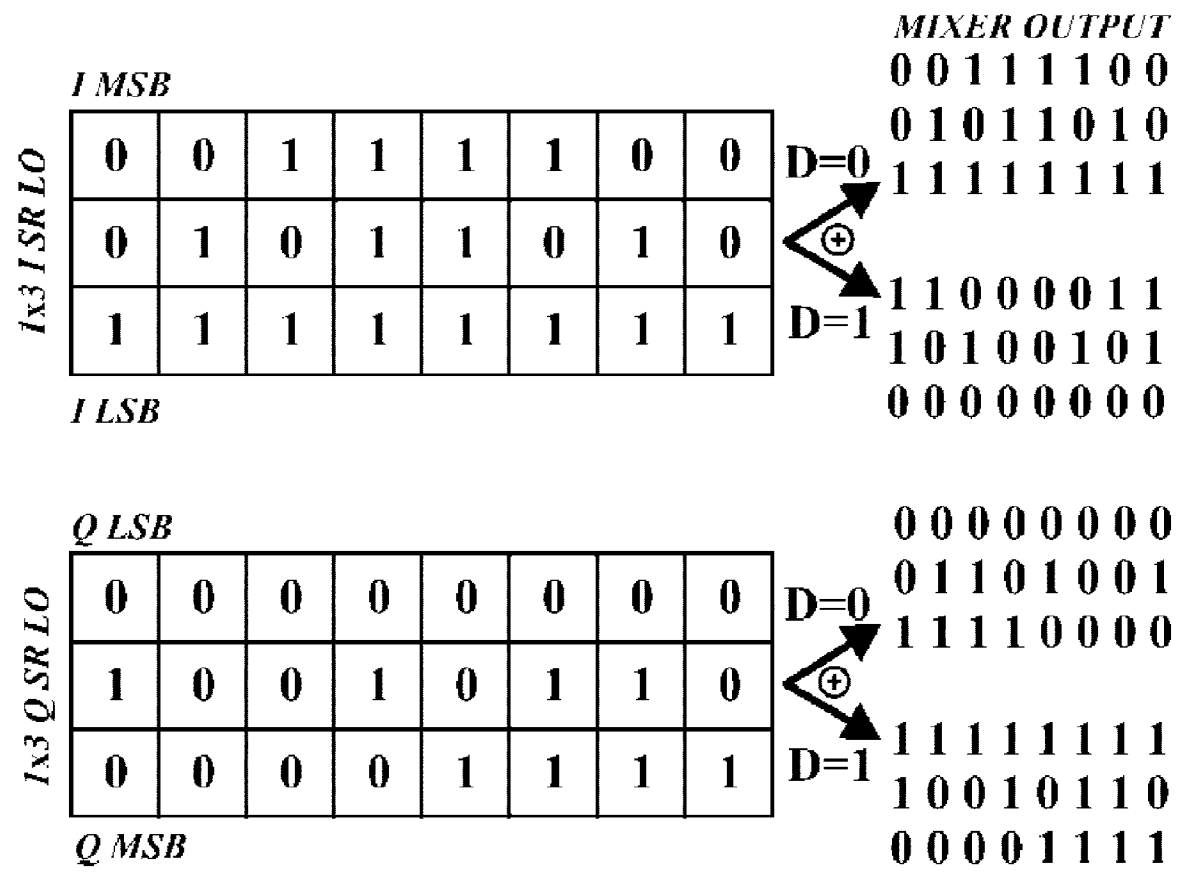
Figure 12B:
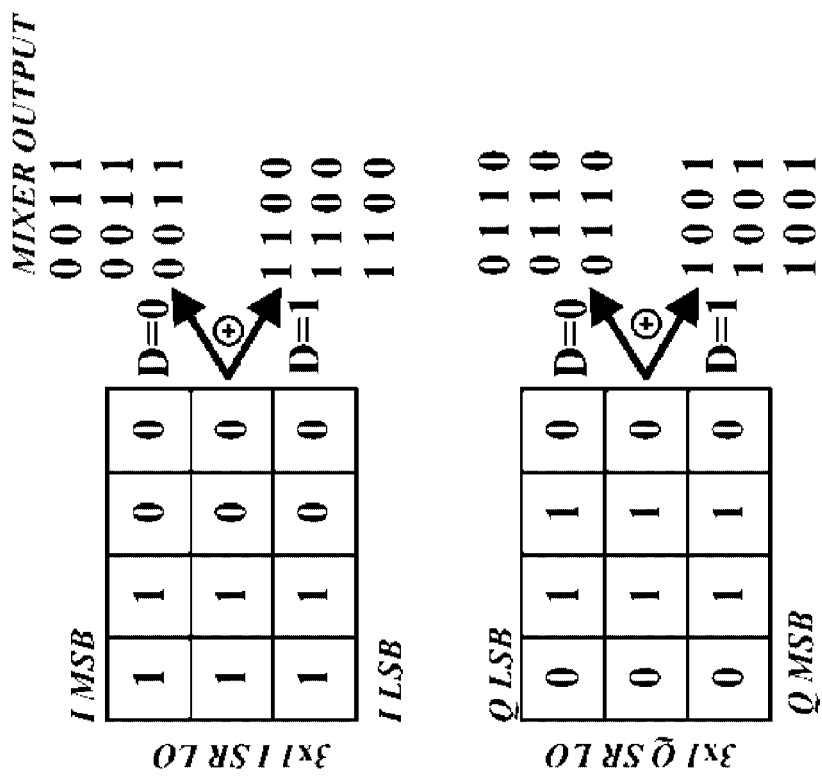
FIG. 12 shows the LO code and data used to test the 3×1 mixer (A) and the 1×3 mixer (B).
Figure 13:
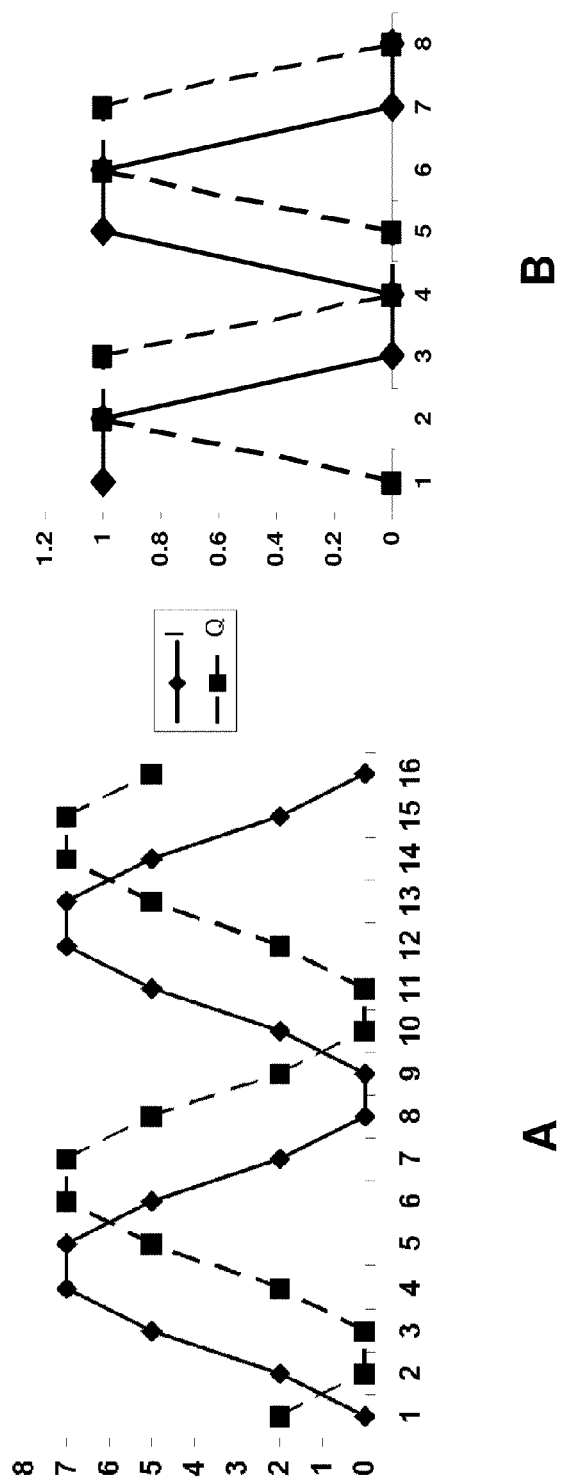
FIG. 13 shows plots of the LO magnitude vs. time, for a 3×1 mixer (A) and a 1×3 mixer (B).

For testing purposes a 3-bit LO code (I and Q components) with a length of 8 was used, as presented in FIG. 12A, with the time-dependence of the weighted magnitude of the 3-bit LO code plotted in FIG. 13A. During testing, the LO code of I and Q LSBs was deliverately kept "all 1s" and "all 0s" and codes of the other two bits shifted by 90°. This artificial code is read out to the RSN-pair-based mixing units (FIG. 4), thence to be read out by either D or its complement $\overline{D}$. If all applied data D are 1s, the mixer's output is inverted code. If data are not applied (all 0s), the mixer's output is just a replication of the stored LO code.

Figure 14:
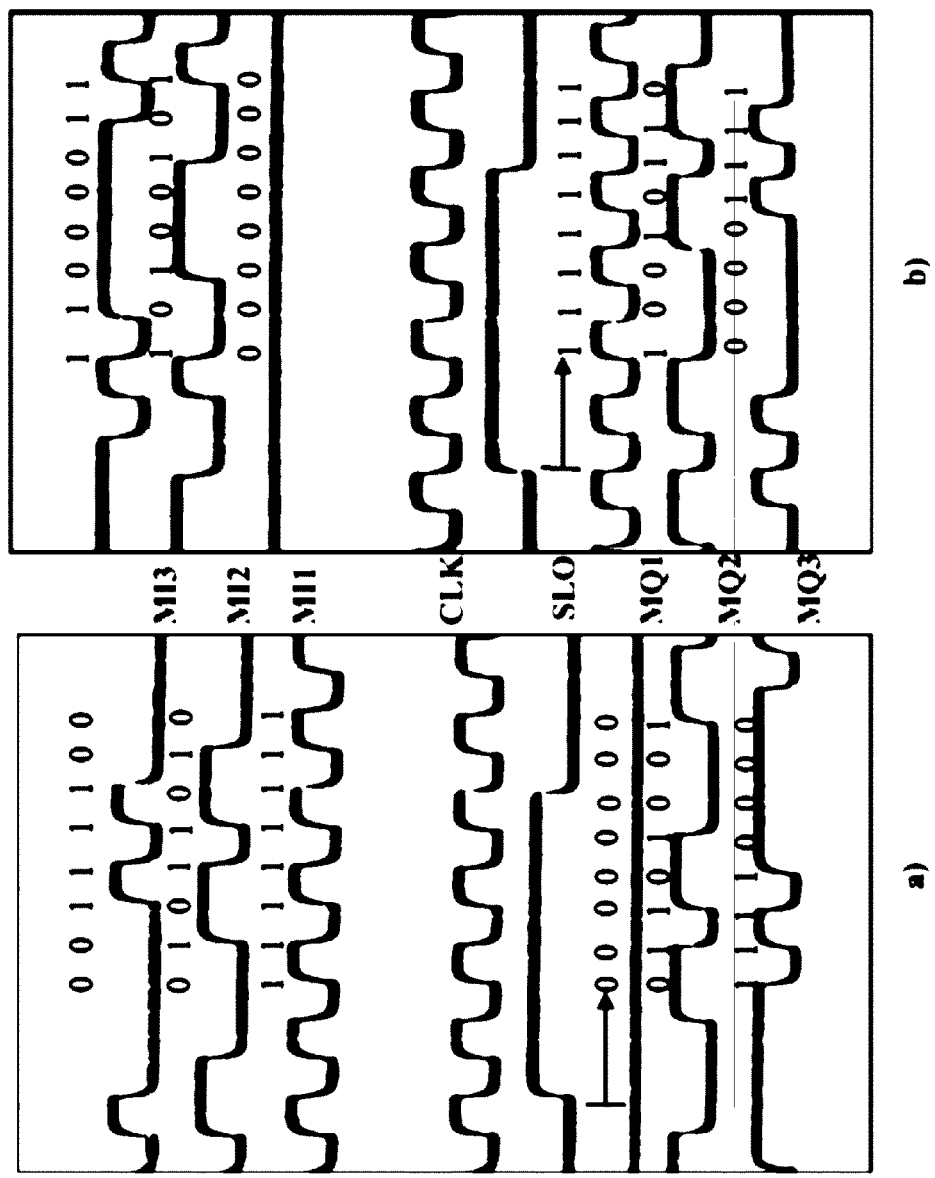
FIG. 14 shows the results of experimental testing of the 1×3 mixer chip, confirming proper operation.

This superconducting 1×3-mixer chip was tested at a temperature T=4.2 K, using a low frequency (~0.5 MHz) for convenience. FIG. 14 shows the results, illustrating the correct behavior. Note that the correct output sequence of 8 pulses appears after the SLO pulse with the predetermined delay of 3 CLK pulses that is a signature of the 1×k-mixer's design.

Figure 15:
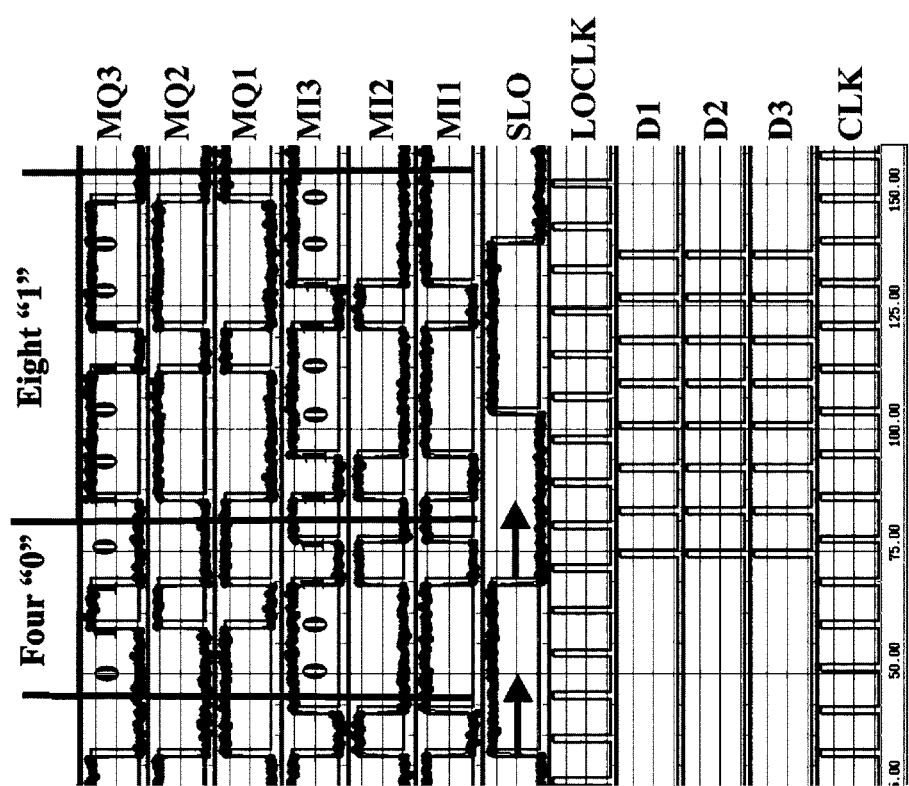
FIG. 15 shows the results of experimental testing of the 3×1 mixer chip, confirming proper operation.

A 3×1-mixer with an LO code (I and Q) as shown in FIG. 12B was designed and tested, with the time-dependence of the 1-bit LO code shown in FIG. 13B. Note that the LO code is identical for all I or Q bits, but shifted by 90° from each other. An automated low-frequency testing setup was used to test this chip at low frequency (~kHz). FIG. 15 illustrates the correct operation of the chip when a test sequence of four 3-bit "0s" and eight 3-bit "1s" is applied. Four "0s" are read out as LO code once, but eight "1s" are read out as inverted code two times in full agreement with FIG. 12B.

Although the functionality of these chips was tested for convenience at low frequencies, the circuit designs are expected to function up to frequencies of order 20 GHz and higher.

Figure 16:
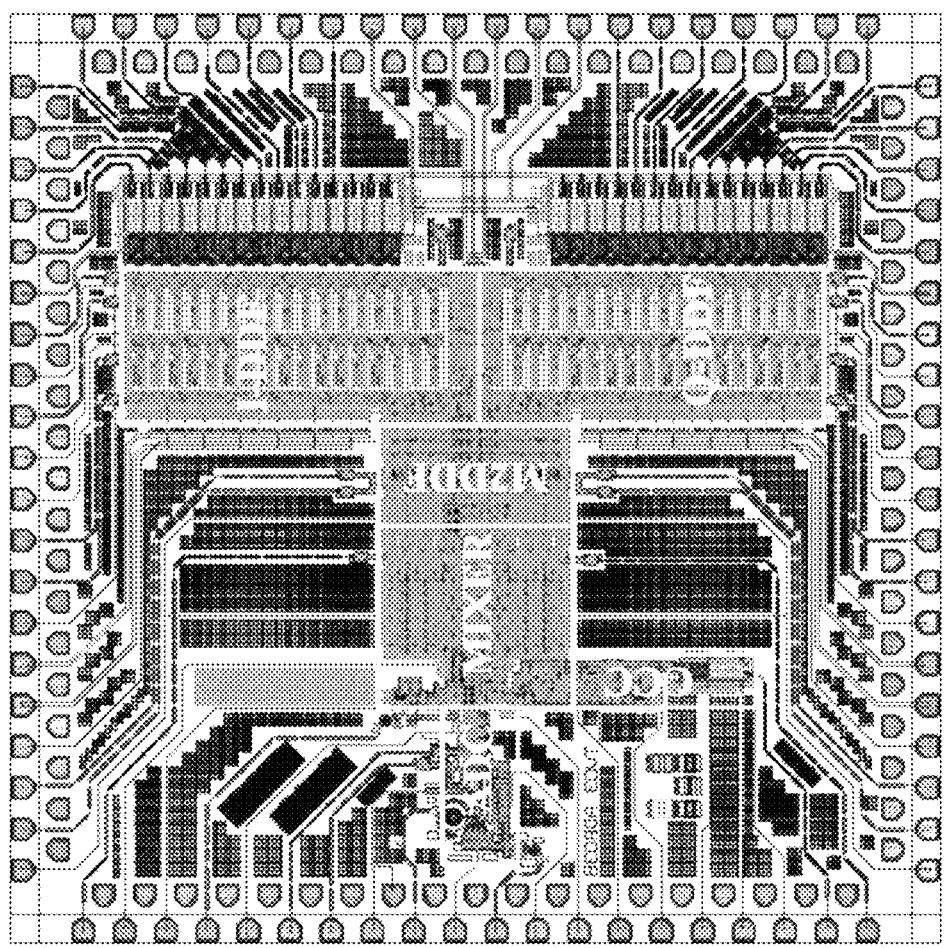
FIG. 16 shows the layout of a lowpass all-digital receiver chip incorporating a 1×3 I&Q mixer circuit.

Multi-bit mixers are parts of future digital radio frequency receivers that also comprise ADCs and digital decimation filters with appropriate output drivers. FIG. 16 shows the layout of a LP ADR (all-digital receiver) on a 10×10 mm superconducting chip, with the mixer layout of FIG. 11 located between the ADC on the left and the DDF on the right.

Multi-bit mixers of both types provide binary-weighted outputs, so they should be fed into the appropriate slices of the digital decimation filter. The geometry of the ADR chip is configured in such a way that the l-bit output of I(Q)-mixer matches the l-bit input of the corresponding I(Q)-DDF. Such an interface between the I(Q) mixer and a corresponding DDF also requires an additional adaptor block (the block labeled M2DDF in FIG. 16) to synchronize their timing. The DDF used features a clock skew of one clock per bit-slice. The interface is designed to delay the l-bit output of the mixer by sending it through a co-flow shift register with the number of stages equal to l. As a result, the mixer's outputs are properly delayed and matched to the timing of the DDF.

Multi-bit mixers provide an increased number of input bits for the DDF. That requires an increase in the number of bit-slices for the DDF. The chip shown in FIG. 16 has two I and Q filters, each comprising 17 bit-slices, that occupy almost all the chip space available for filters in this particular configuration.

The embodiments of the multi-bit digital mixer presented above incorporate an integrated hard-wired digital LO circuit. These are compact and efficient, but in some cases, a reprogrammable digital LO may be desirable. This may be achieved using an external digital generator, but the ultra-high-speed operation of this digital mixer circuit requires careful consideration of synchronization. In the approach illustrated in FIG. 6, a large capacity room-temperature semiconductor memory was combined with a fast cryogenic RSFQ cache, integrated on the same chip with an RSFQ digital signal processor. The asymmetric nature of the required memory operation—fast readout, infrequent addressing, no writing functions—allows utilization of pipeline loading in order to avoid latency issues.

Figure 1A:
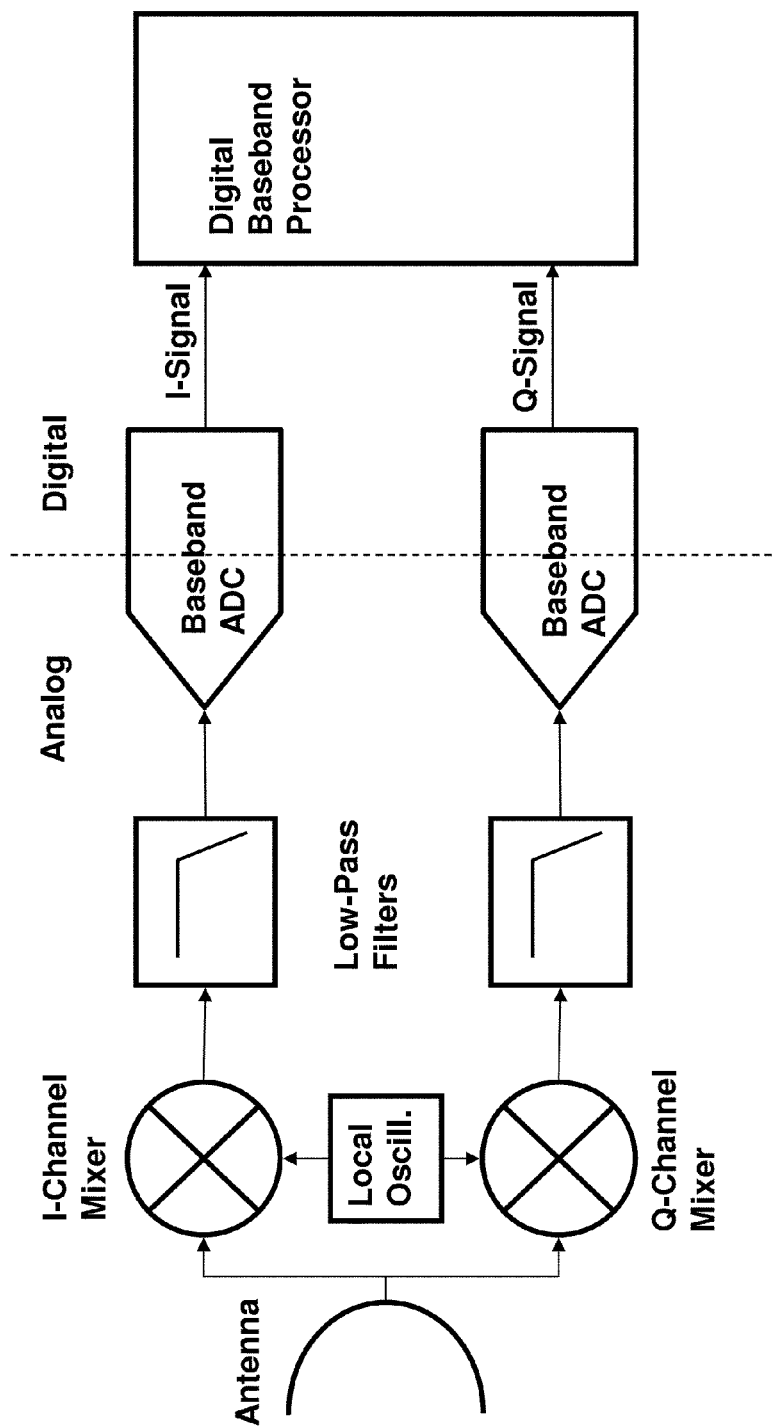
FIG. 1A shows a block diagram of a conventional I&Q radio receiver with an analog front end, comprising an analog local oscillator (LO) and an analog mixer.
Figure 1B:
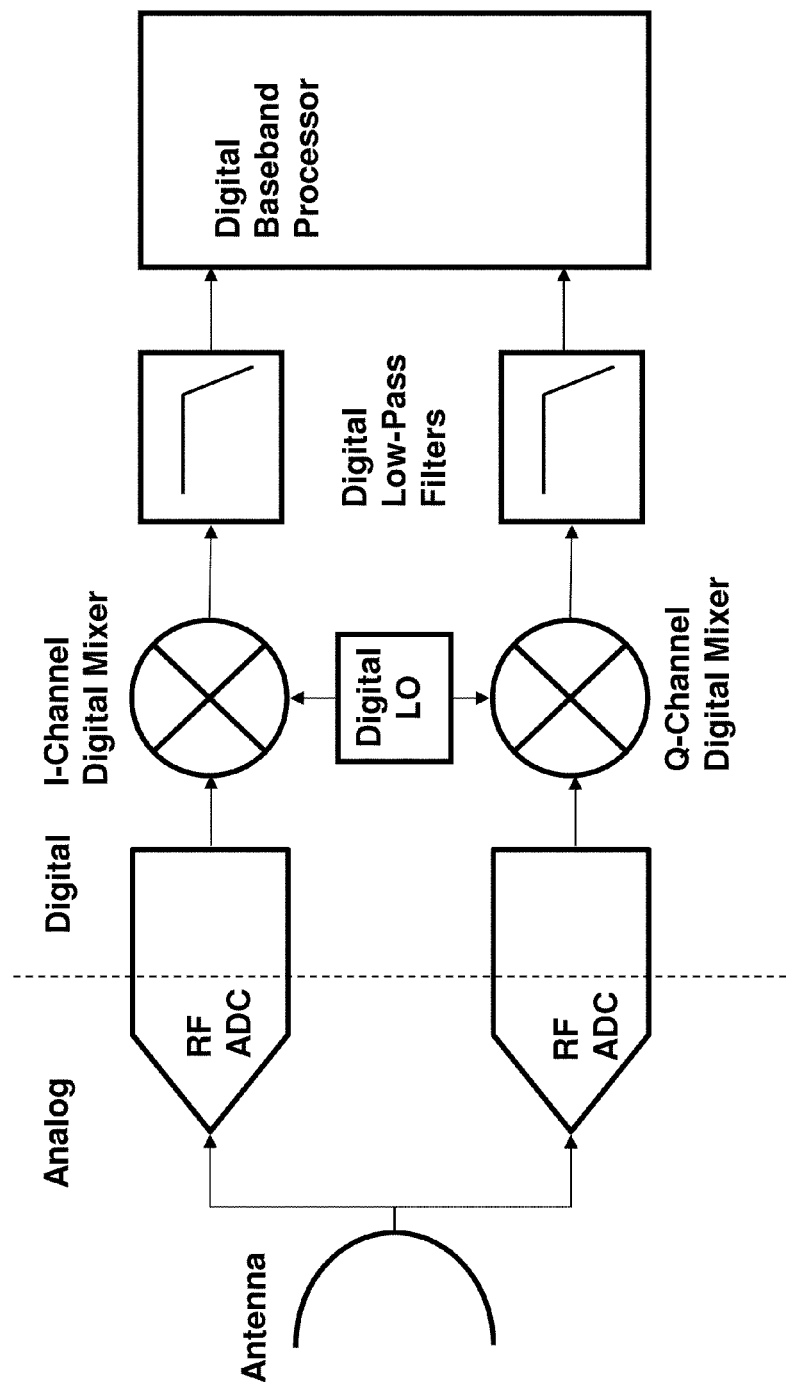
FIG. 1B shows a block diagram of a digital radio frequency receiver (I&Q channels) with a broadband ADC digitizing the RF signal directly, comprising a digital LO and a digital mixer.
Figure 6:
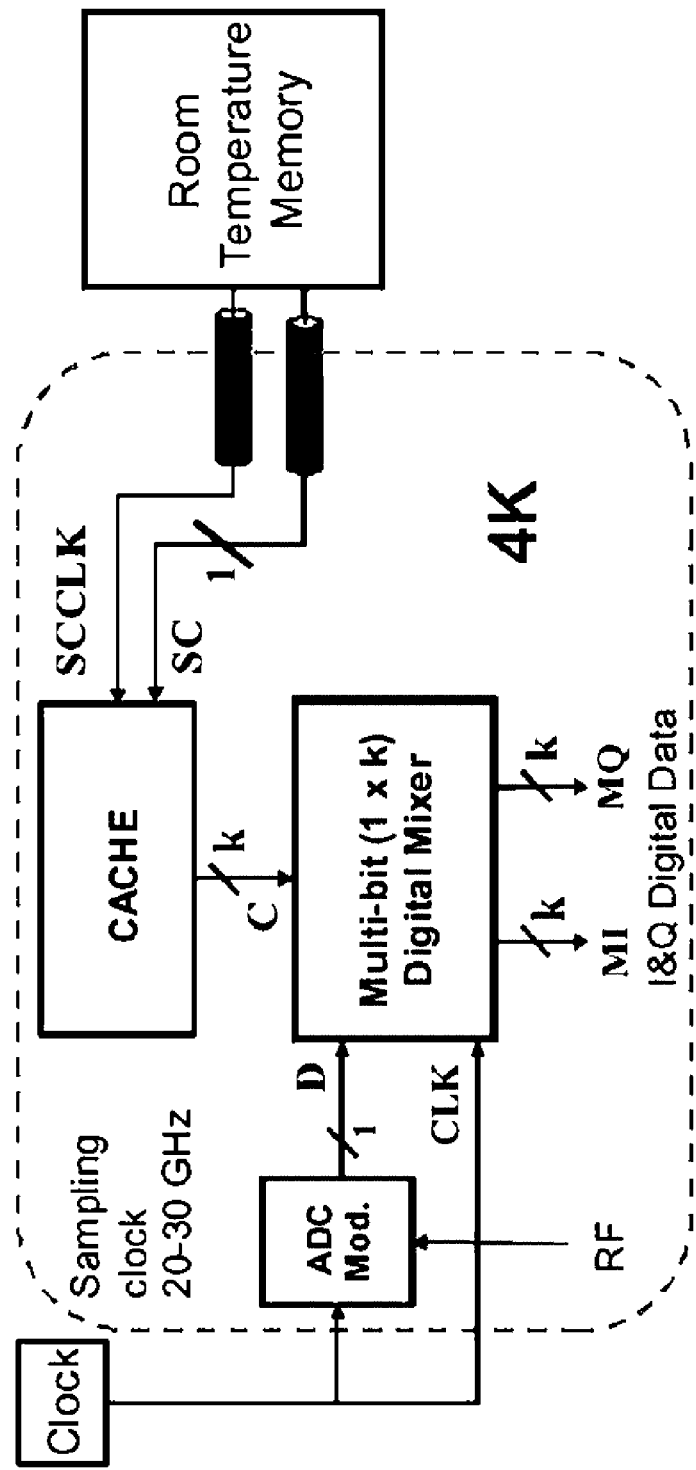
FIG. 6 shows the block diagram of an alternative digital radio frequency receiver with a superconducting multi-bit mixer and an externally generated LO.

FIG. 6 shows a hybrid memory configuration and its integration into a Digital radio frequency channelizing receiver (such as that in FIG. 1B). This consists of a room-temperature high-capacity memory capable of fast readout and a cryogenic superconducting RSFQ cache capable of receiving serial data, deserializing, and re-synchronizing the multiple bits. This cache memory is integrated with the In-phase (I)

and Quadrature (Q) sections of a multi-bit digital mixer very similar to that shown in FIG. 4.

For multi-bit mixing or correlation, the room-temperature memory should ideally supply multi-bit words at the sampling clock frequency (20-30 GHz). However, it is impractical to send all bits in parallel due to inevitable inter-bit jitter during transmission over the rather long distance between a room-temperature memory module and a cryogenic RF DSP. To avoid this problem, data was serially supplied and then on-chip data deserialization and re-synchronization performed. In FIG. 6, the serialized coded LO data is labeled SC, and the serializer clock is labeled SCCLK.

A particular objective was to find a commercially-available memory unit with a relatively deep storage capacity (at least 64 Mbit) and capable of providing a 30 Gbps single-bit output data. These requirements match well to those of Arbitrary Bit Sequence Generators (ABSGs) such as the Sympuls BMG 30G-64M 30 GBit/s pattern generator (see, for example, www.sympuls-aachen.de/en/bmg.html). This generates programmable binary sequences operating with an external clock generator between 1 and 30 Gbit/s, with up to 64 Mb of memory.

The main function of the cache circuit is to receive high-speed serial data (SC) from the ABSG at room temperature, perform data synchronization (find end-of-word), and deserialize data into parallel output words for the digital mixer. To facilitate synchronization, the last bit in the data word was reserved as the end-of-word bit.

Figure 17:
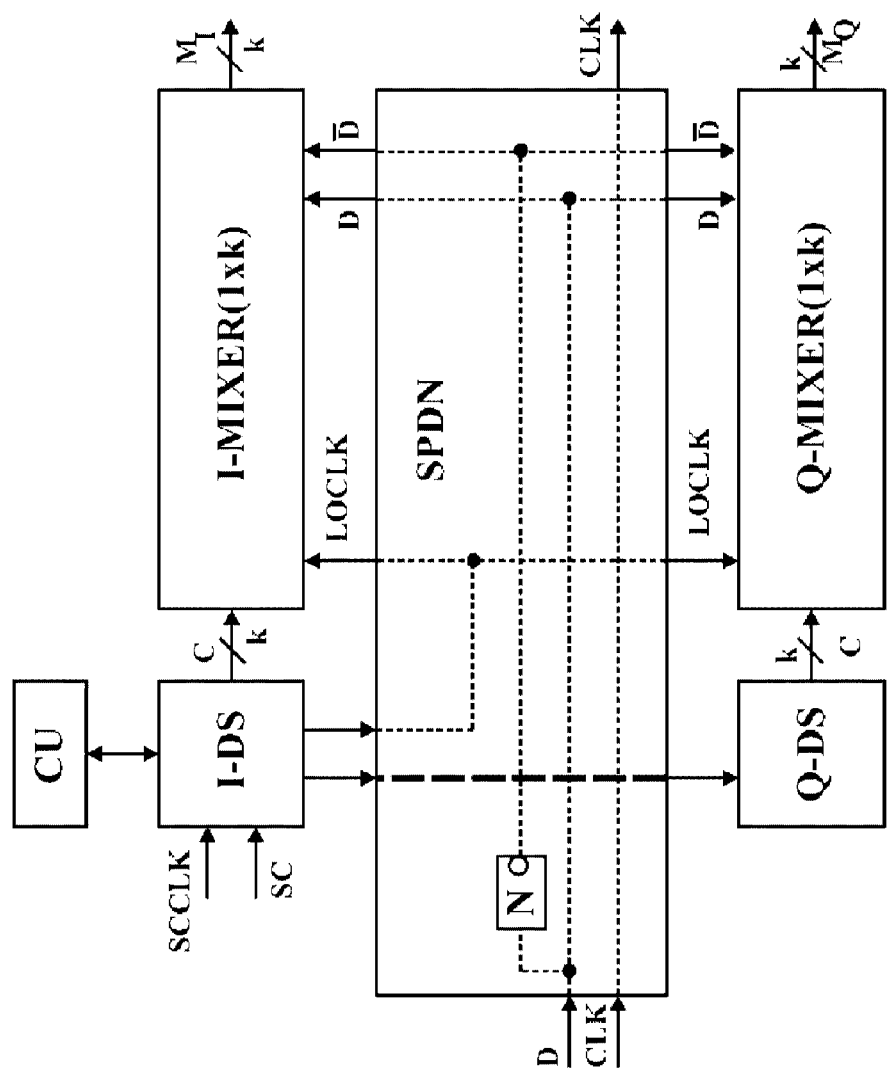
FIG. 17 shows the block diagram of an I&Q digital mixer for a 1-bit data signal with a k-bit LO (1×k mixer), similar to FIG. 4, but with a cache block (comprising deserializers DS) receiving an externally generated LO code as shown in FIG. 6.

The deserializing cache memory modules are integrated with the multi-bit digital mixer on the same chip. In order to facilitate the integration, the previous design of the 1×k multi-bit mixer (FIGS. 4 and 5) was modified. FIG. 17 shows the block diagram adapted for integration with the cache memory circuits. This comprises two deserializer (DS) units, one each for the I and Q channels, with a clock control unit (CU) that controls both of them. The various clock and data signals are synchronized in a synchronous pulse distribution network (SPDN) very similar to that in FIG. 4.

Figure 18:
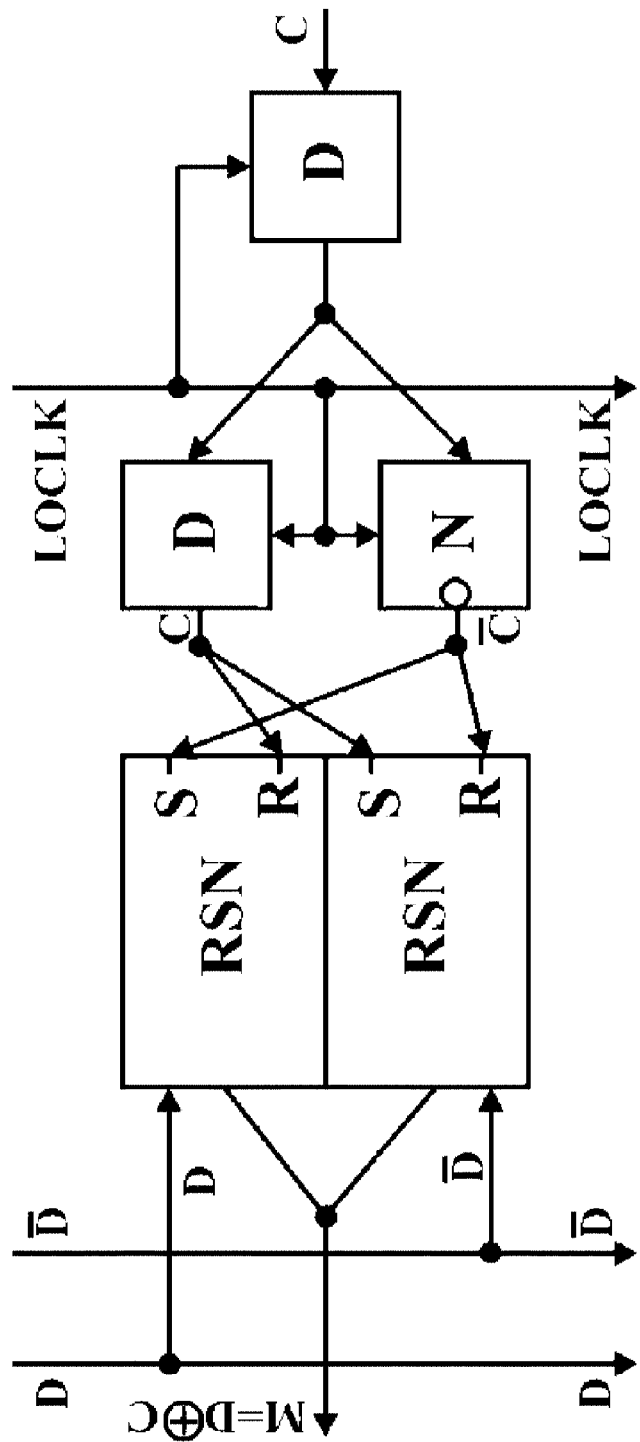
FIG. 18 shows the cell diagram of a bit-slice of a 1×k digital mixer without integrated LO of FIG. 17.

The cell-based design of single-bit slices of the mixer blocks in FIG. 17 is shown in FIG. 18, similar to that in FIG. 5. Specifically, a buffer (the rightmost DFF) was placed between the deserializer and the mixer for synchronizing the master clock (CLK) of the mixer with the LO code C. The LO code is stored in RSN cells for several sampling clock (CLK) cycles until the next parallelized LO code arrives. With this timing design, the cache and the mixer can operate under different independent clocks (SCCLK and CLK). Thus, the room-temperature memory does not have to be synchronized with the RSFQ processor master clock. The LO code loaded to the mixer LO inputs can be used for multiple cycles of RF data.

Figure 19:
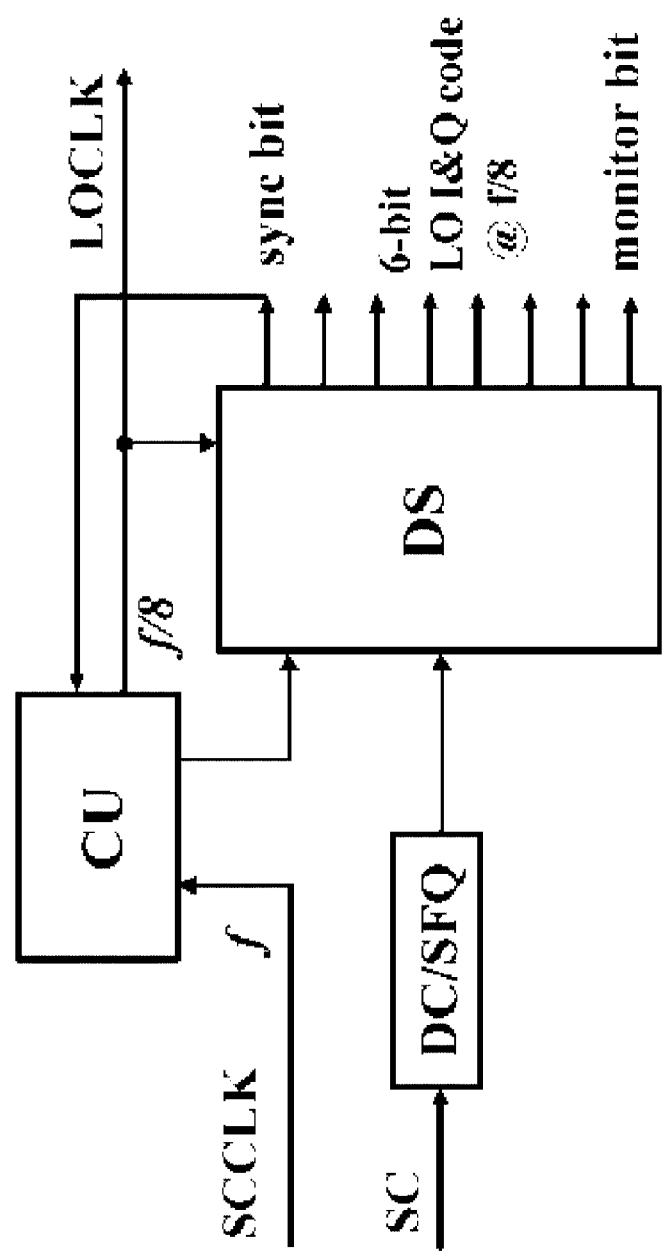
FIG. 19 shows the block diagram of an RSFQ cache memory circuit for multi-bit LO re-synchronization, as in FIGS. 6 and 17.

FIG. 19 shows a block diagram of the cache circuit. The deserializer part (DS) of the cache design is based on a shift-and-dump demultiplexer architecture (similar to that in S. B. Kaplan et al., IEEE Trans. Appl. Supercond., vol. 5, pp. 2853-2856, June 1995, expressly incorporated herein by reference) and implemented using dual-port DFF cells derived from B flip-flops (described in S. Polonsky, et al., IEEE Trans. Appl. Supercond., vol. 4, pp. 9-18, March 1994, expressly incorporated herein by reference). The data synchronization is performed by a clock controller circuit (CU) consisting of a static frequency divider and a synchronization circuit. The serialized data is received by a high-speed DC-to-SFQ converter and applied to a deserializer (DS). In this example, the clock controller splits every 8 pulses of external high-speed clock SCCLK into 7 serial clock pulses and 1 parallel read-out clock pulse which destructively reads out the content of the deserializer. The last bit (sync bit) of the readout word is fed back to the clock controller to provide data synchronization. If the synchronization bit has the wrong value, the clock controller shifts the read-out clock by one period, searching for the end-of-word symbol, thus automatically recovering the lost synchronization.

In a prototype device demonstration, due to space limitations on the test chip (5 mm×5 mm), it was decided to limit the LO word length to 3 bits for I and Q components. Consequently, the 8-bit cache was divided into a 4-bit block I-DS and a 4-bit block Q-DS in order to accommodate 1 bit for synchronization, 6 bits for the LO code payload (3-bit I and 3-bit Q), and 1 bit for monitor.

Figure 20:
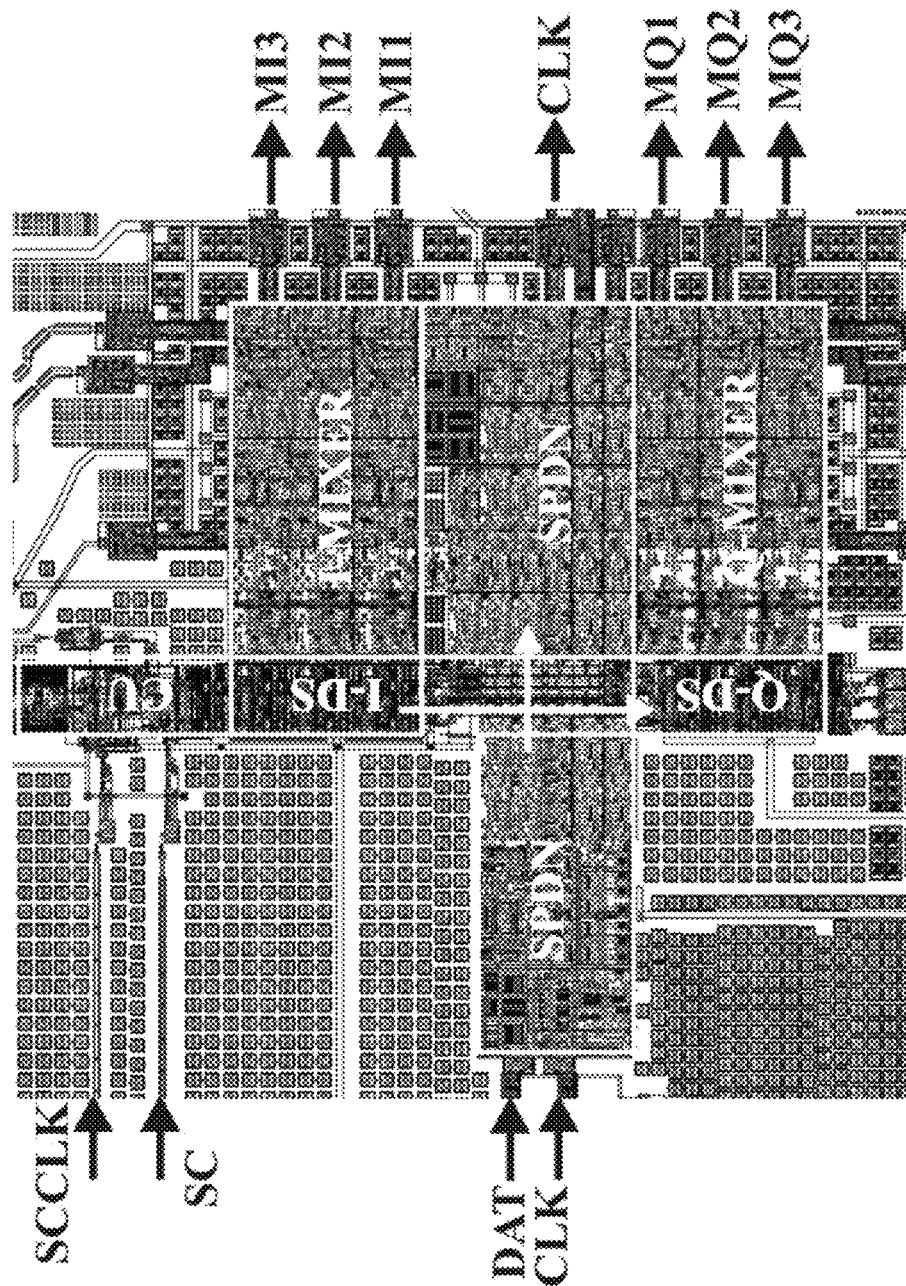
FIG. 20 shows a portion of the chip layout for a 1×3 digital mixer with external LO generator and on-chip integrated cache memory.

FIG. 20 shows the layout of a section of the prototype chip with integrated cache circuit and the 1×3 digital I&Q mixer fabricated using the HYPRES standard superconducting niobium 4.5 kA/cm$^2$ process. The 7-bit cache circuit is divided using a set of microstrip lines traversing the synchronous pulse distribution network (SPDN) section. This chip was tested at cryogenic temperatures of 4.2 K, and verified high-speed operation of all major components including separate cache circuits and digital mixer blocks.

This design is adequate for digital radio frequency channelizing receivers, since the LO code is relatively short. The loading rate of the room temperature memory limits the maximum frequency of the LO—for a 30 Gbps loading rate, a 3.75 GHz maximum LO frequency can be realized. For higher LO frequencies, multiple parallel cache modules would have to be used in a pipelined fashion. For longer templates necessary for a digital radio frequency cross-correlation receiver, a longer on-chip cache would be required.

The present embodiments are considered in all respects to be illustrative and not restrictive, and all changes which come within the meaning and range of equivalency of the claims are therefore intended to be embraced within. The invention may be embodied in other specific forms without departing from the spirit or essential characteristics thereof. The disclosure shall be interpreted to encompass all of the various combinations and permutations of the elements, steps, and claims disclosed herein, to the extent consistent, and shall not be limited to specific combinations as provided in the detailed embodiments.

What is claimed is:

1. A digital radio frequency receiver apparatus, comprising:
    a radio-frequency digitizer, configured to accept an analog input and to generate at least one stream of digital output bits at a rate set by a sampling clock;
    a digital signal synthesizer, configured to generate an output comprising at least one stream of digital output bits at a second clock rate;
    at least one multi-bit parallel digital mixer, configured in a circuit to receive a first digital input signal comprising the at least one stream of digital output bits at a rate set by a sampling clock and a second digital input signal comprising the at least one stream of digital output bits at a second clock rate, and to generate a multi-bit parallel output signal representing a product of the first digital input signal and the second digital input signal;
    at least one digital filter, configured to accept as an input the multi-bit parallel output signal of the at least one mixer, and to generate at least one digital output stream at a third clock rate, representing a filtered representation of the input;
    wherein at least one of the digitizer, synthesizer, mixer, and filter comprises at least one Josephson junction.

2. A digital mixing method, comprising:
receiving two asynchronous rapid single quantum flux (RSFQ) signals, at least one of the received RSFQ signals comprising a plurality of parallel bits, wherein each signal bit is represented as complementary signal pairs, a first of the RSFQ signals representing a digitized analog input from an analog radio frequency receiver at a first clock rate, and a second of the RSFQ signals representing an output of a digital signal synthesizer at a second clock rate;
synchronizing a timing of the plurality of parallel bits of the two asynchronous RSFQ signals with a synchronous pulse distribution network (SPDN);
mixing the properly timed two asynchronous RSFQ signals with an array of XOR-based asynchronous mixer cells each comprising at least one Josephson junction, at least one for each parallel bit line; and
digitally filtering a mixed output of the array of XOR-based asynchronous mixer cells to produce a digital output stream at a third clock rate.

3. The method of claim 2, wherein the digitized analog input represents an analog radio frequency signal sampled at a sampling clock rate in excess of 20 gigasamples per second.

4. The receiver of claim 1, wherein the at least one stream of output bits represents the analog input sampled at a sampling clock rate in excess of 20 gigasamples per second.

5. The receiver of claim 1, wherein the digital signal synthesizer comprises a digital local oscillator.

6. The receiver of claim 5, wherein the digital local oscillator delivers a plurality of distinct digital outputs to a plurality of digital mixers in parallel.

7. The receiver of claim 1, wherein the at least one multi-bit parallel digital mixer comprises at least two multi-bit parallel digital mixers, receiving respectively quadrature phase shifted representations of the output of the digital signal synthesizer, configured to comprise a digital quadrature receiver.

8. The receiver of claim 1, being further configured to comprise a digital correlation receiver.

9. The receiver of claim 1, comprising an integrated circuit comprising at least two of the radio-frequency digitizer, digital signal synthesizer, multi-bit parallel mixer, and digital filter manufactured on the same die.

10. The receiver of claim 9, wherein the integrated circuit has a design layout comprising a plurality of modular bit slices for processing respective bits of the multi-bit parallel mixer.

11. The receiver of claim 1, wherein the digital signal synthesizer comprises at least two units, of which at least one unit operates at a cryogenic temperature, and at least one unit operates at an ambient temperature.

12. The receiver of claim 11, wherein the ambient temperature unit comprises a semiconductor memory unit with a digital readout, and the cryogenic unit comprises a superconducting digital signal processor, the semiconductor memory unit being configured to send at least one stream of data to the digital signal processor.

13. The receiver of claim 12, further comprising a serializer configured to serialize the at least one stream of data from a readout of the memory unit and a deserializer configured to deserialize the serialized at least one stream of data sent to the cryogenic signal processor.

14. The receiver of claim 12, wherein the cryogenic signal processor further comprises at least one fast cache memory module.

15. The receiver of claim 14, wherein the semiconductor memory unit comprises a plurality of cache memory modules organized in a pipelined fashion for high frequency operation.

16. The receiver of claim 12, wherein the superconducting digital signal processor comprises a clock resynchronization circuit.

17. The receiver of claim 12, wherein the semiconductor memory unit comprises a digital arbitrary waveform generator.

18. The receiver of claim 1, wherein the at least one Josephson junction operates according to Rapid Single Flux Quantum (RSFQ) Logic.

19. The receiver of claim 1, wherein a synchronization between a plurality of bit streams in a respective multi-bit parallel digital mixer is maintained using a Synchronous Pulse Distribution Network (SPDN).

20. The receiver of claim 1, wherein the first digital input signal and the second digital input signal are asynchronous.

* * * * *